(12) United States Patent  
Naruse

(10) Patent No.: US 12,027,492 B2  
(45) Date of Patent: Jul. 2, 2024

(54) SEMICONDUCTOR MODULE AND SEMICONDUCTOR DEVICE

(71) Applicant: AISIN CORPORATION, Aichi (JP)

(72) Inventor: Takanobu Naruse, Kariya (JP)

(73) Assignee: AISIN CORPORATION, Aichi (JP)

( * ) Notice: Subject to any disclaimer, the term of this patent is extended or adjusted under 35 U.S.C. 154(b) by 235 days.

(21) Appl. No.: 17/311,469

(22) PCT Filed: Sep. 12, 2019

(86) PCT No.: PCT/JP2019/035864  
§ 371 (c)(1),  
(2) Date: Jun. 7, 2021

(87) PCT Pub. No.: WO2020/179110  
PCT Pub. Date: Sep. 10, 2020

(65) Prior Publication Data  
US 2022/0028828 A1    Jan. 27, 2022

(30) Foreign Application Priority Data

Mar. 5, 2019  (JP) ................................ 2019-039470

(51) Int. Cl.  
*H01L 25/065* (2023.01)  
*H01L 23/00* (2006.01)  
*H01L 23/538* (2006.01)

(52) U.S. Cl.  
CPC ...... *H01L 25/0652* (2013.01); *H01L 23/5384* (2013.01); *H01L 23/5386* (2013.01);  
(Continued)

(58) Field of Classification Search  
CPC .......... H05K 2201/09227; H05K 2201/09954; H05K 2201/09972; H05K 1/0296;  
(Continued)

(56) References Cited

U.S. PATENT DOCUMENTS 6,163,071 A    12/2000  Yamamura  
2004/0164385 A1    8/2004  Kado et al.  
(Continued)

FOREIGN PATENT DOCUMENTS

WO    99/24896 A1    5/1999  
WO    02/103793 A1    12/2002

OTHER PUBLICATIONS

Extended European Search Report dated Mar. 28, 2022 in European Application No. 19917977.1.  
(Continued)

*Primary Examiner* — Nicholas J Tobergte  
*Assistant Examiner* — Illiam Henry Anderson  
(74) *Attorney, Agent, or Firm* — Sughrue Mion, PLLC

(57) ABSTRACT

Connection terminals of a semiconductor module are disposed appropriately in accordance with the connection destination of the semiconductor module. A semiconductor module which includes at least one semiconductor element is mounted on a first surface of a main substrate, which has the first surface on which a first circuit element is mounted and a second surface on which a second circuit element is mounted. A plurality of connection terminals include a first connection terminal group composed of a plurality of first connection terminals to be connected to the first circuit element via the main substrate, and a second connection terminal group composed of a plurality of second connection terminals to be connected to the second circuit element via the main substrate. The first connection terminal group is disposed on the outer peripheral side with respect to the second connection terminal group.

8 Claims, 10 Drawing Sheets

(52) U.S. Cl.
CPC .............. *H01L 24/14* (2013.01); *H01L 24/16* (2013.01); *H01L 24/17* (2013.01); *H01L 2224/14135* (2013.01); *H01L 2224/16227* (2013.01); *H01L 2224/17515* (2013.01); *H05K 2201/09227* (2013.01); *H05K 2201/10545* (2013.01)

(58) Field of Classification Search
CPC ........... H01L 23/49844; H01L 23/5286; H01L 2224/17515; H01L 23/528; H01L 23/5283
See application file for complete search history.

(56) References Cited

U.S. PATENT DOCUMENTS

| | | | |
|---|---|---|---|
| 2006/0189031 | A1 | 8/2006 | Kado et al. |
| 2008/0245556 | A1* | 10/2008 | Bird ...................... H05K 1/113 174/262 |
| 2008/0250373 | A1* | 10/2008 | Bird ...................... H05K 1/113 716/125 |
| 2008/0250377 | A1* | 10/2008 | Bird ................... G01R 31/2818 324/754.01 |
| 2009/0189268 | A1 | 7/2009 | Kado et al. |
| 2010/0015760 | A1 | 1/2010 | Kado et al. |
| 2010/0090333 | A1* | 4/2010 | Hayashi ............ H01L 23/49838 257/E21.511 |
| 2011/0171780 | A1 | 7/2011 | Kado et al. |
| 2012/0264240 | A1 | 10/2012 | Kado et al. |
| 2013/0320571 | A1 | 12/2013 | Kado et al. |
| 2014/0117541 | A1 | 5/2014 | Kado et al. |
| 2014/0202752 | A1 | 7/2014 | Akahoshi |
| 2015/0054155 | A1* | 2/2015 | Ohara ................... H01L 23/562 257/738 |
| 2015/0108639 | A1 | 4/2015 | Kado et al. |
| 2018/0124916 | A1* | 5/2018 | Hattori ................. H05K 1/0298 |
| 2018/0204827 | A1 | 7/2018 | Betsui et al. |

OTHER PUBLICATIONS

International Search Report of PCT/JP2019/035864 dated Nov. 26, 2019 [PCT/ISA/210].

\* cited by examiner

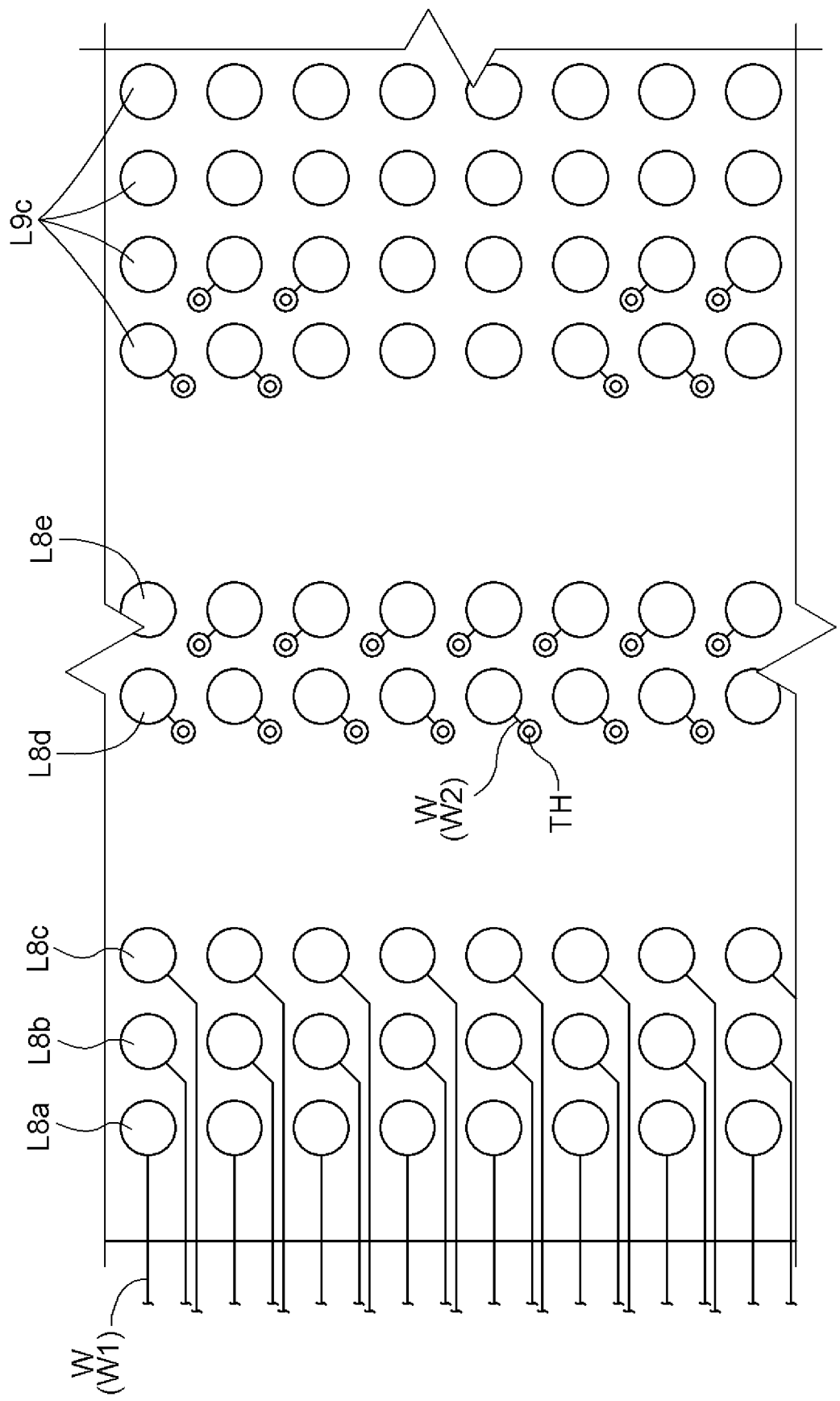

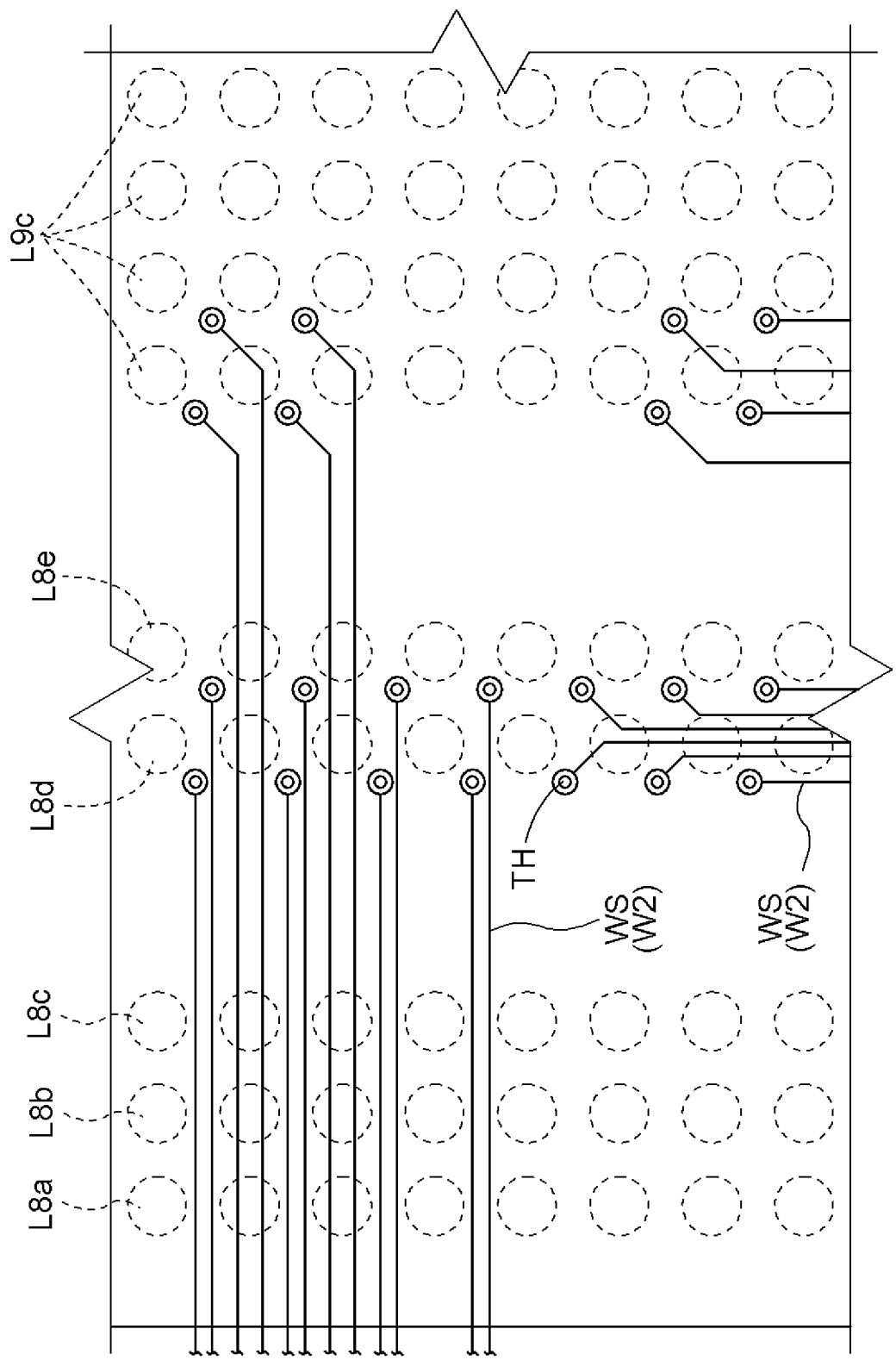

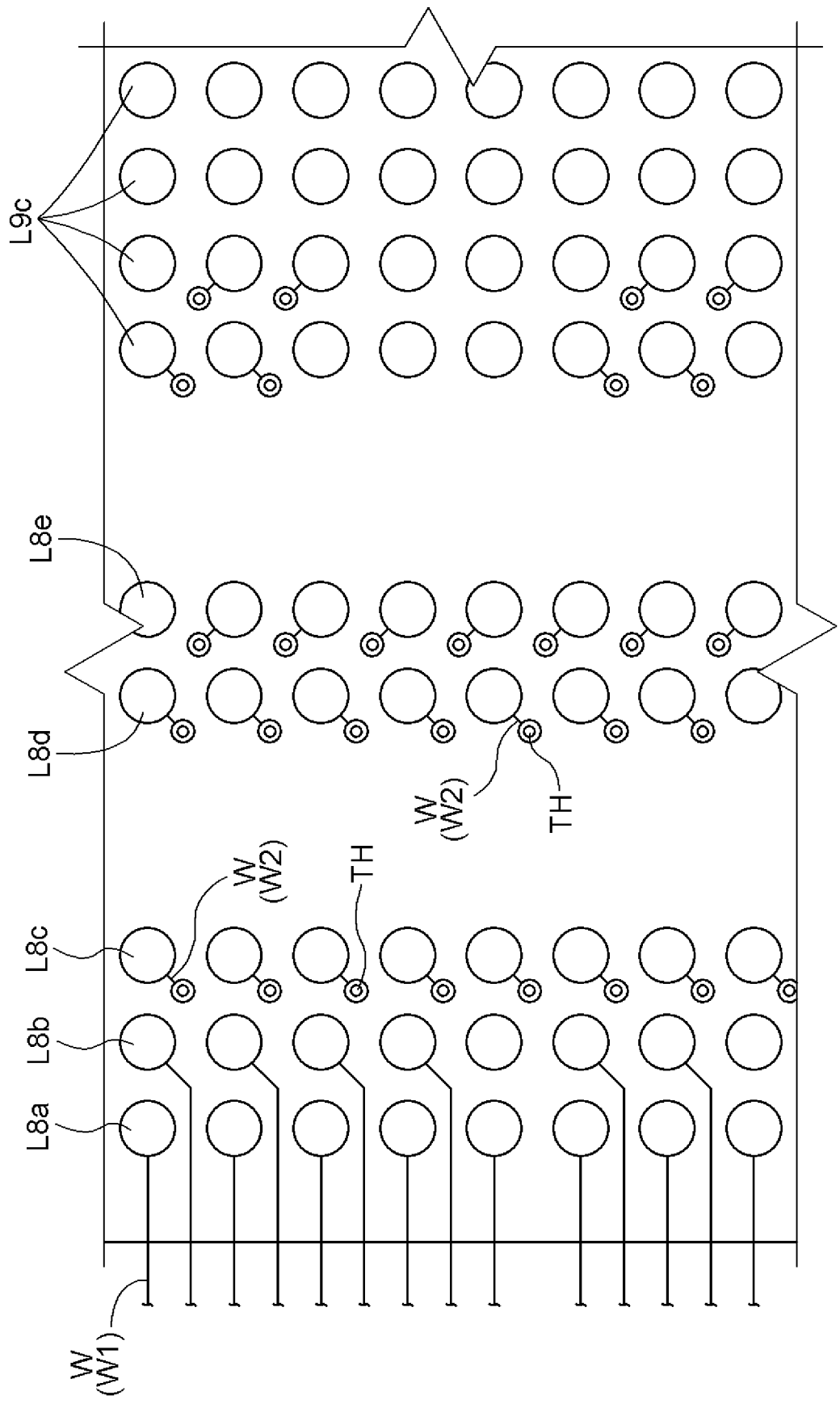

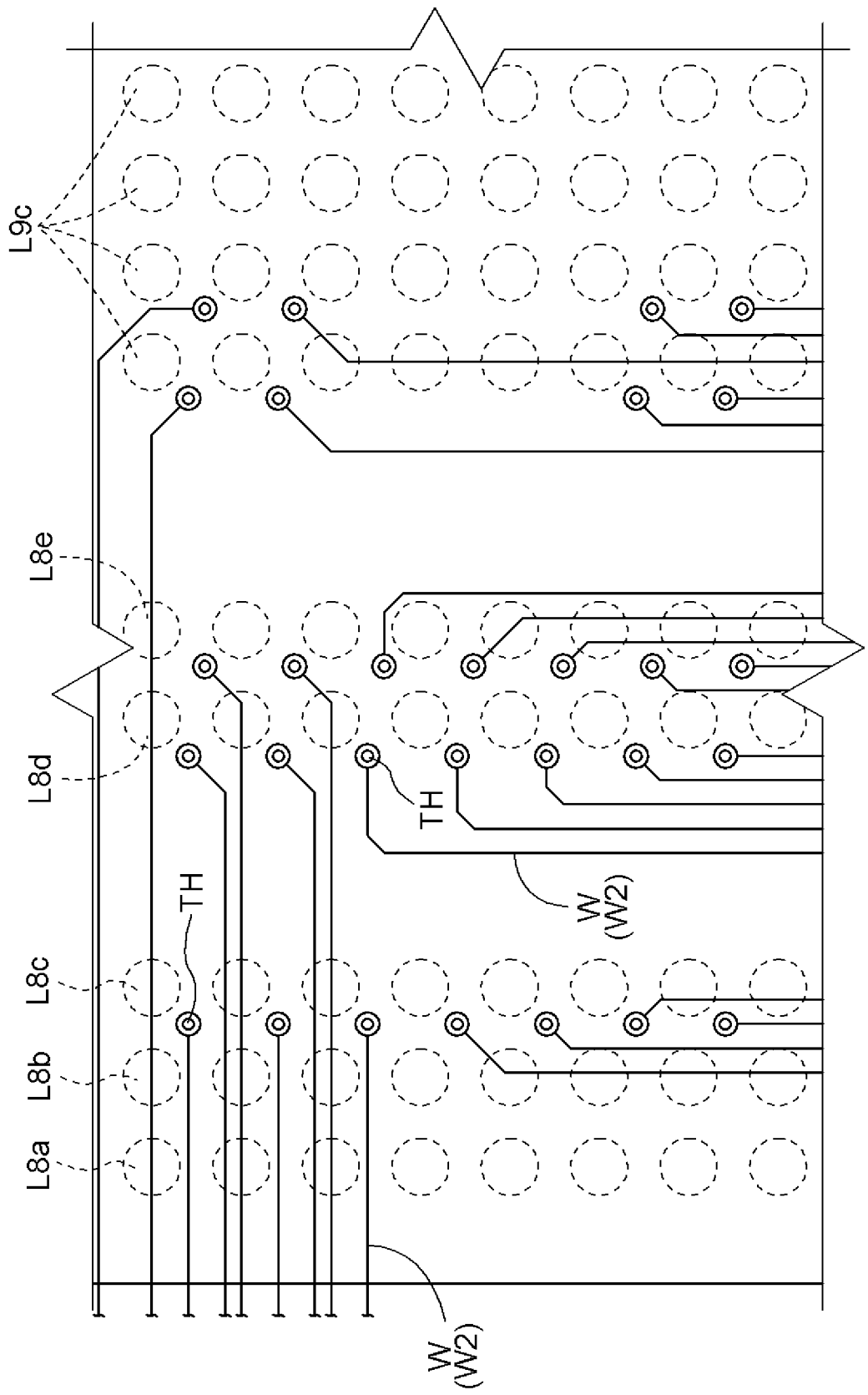

SEMICONDUCTOR MODULE AND SEMICONDUCTOR DEVICE

CROSS REFERENCE TO RELATED APPLICATIONS

This application is a National Stage of International Application No. PCT/JP2019/035864, filed Sep. 12, 2019, claiming priority to Japanese Patent Application No. 2019-039470, filed Mar. 5, 2019, the entire contents of which are incorporated in their entirety.

TECHNICAL FIELD

The present disclosure relates to a semiconductor module that includes at least one semiconductor element, and to a semiconductor device that includes the semiconductor module.

BACKGROUND ART

WO 2002/103793 discloses a semiconductor module (multi-chip module (MCM)) in which a plurality of chips (1A, 2B, 3B) such as processors are mounted on one surface of a package substrate (1) and solder bumps (11) are disposed on the other surface to constitute external connection terminals (symbols in parentheses in "BACKGROUND ART" correspond to those used in the referenced document). The external connection terminals are often disposed in a concentrated manner for each identical function (or deeply associated functions) in consideration of the wiring distance to the connection destination etc. In the multi-chip module, for example, address pins (A) and data pins (D) to be connected to a memory are disposed in a concentrated manner in respective specific regions (see FIG. 3, 40, etc. of the international patent application publication).

RELATED ART DOCUMENTS

Patent Documents

Patent Document 1: WO 2002/103793

SUMMARY OF THE DISCLOSURE

Problem to be Solved by Various Aspects of the Disclosure

The multi-chip module has external connection terminals arranged in the shape of four rectangular rings, and the address pins (A) and the data pins (D) are disposed in the first rectangular ring on the outermost peripheral side to the fourth rectangular ring on the innermost peripheral side. Therefore, it is difficult to lead out wires from all the terminals on a substrate surface (mounting surface) on which the package substrate (1) is mounted (to which the external connection terminals are connected). That is, it is necessary to install wires for a part of the plurality of external connection terminals for an identical function using a surface on the opposite side from the mounting surface or an inner wiring layer via a through hole.

The computation processing speed of a microprocessor and the speed of communication between the microprocessor and peripheral devices have been increasing in recent years, and the frequency of signals sent to the external connection terminals of the multi-chip module also has been increasing. Signals at a high frequency tend to be reflected when passing through a through hole, and the reliability of transmission may be lowered because of disturbance in the waveform due to such reflection. When the wires pass through a through hole, the wire length may be increased to increase a signal delay.

In view of the foregoing background, it is desirable to dispose connection terminals of a semiconductor module appropriately in accordance with the connection destination of the semiconductor module.

Means for Solving the Problem

In view of the above, an aspect provides a semiconductor module mounted on a first surface of a main substrate and including at least one semiconductor element, with a first circuit element mounted on the first surface and with a second circuit element mounted on a second surface on an opposite side from the first surface, the semiconductor module including: a plurality of connection terminals disposed in a shape of a plurality of rectangular rings on a side of a facing surface that faces the main substrate to be connected to the main substrate, in which: the plurality of connection terminals include a first connection terminal group composed of a plurality of first connection terminals to be connected to the first circuit element via the main substrate, and a second connection terminal group composed of a plurality of second connection terminals to be connected to the second circuit element via the main substrate; and the first connection terminal group is disposed on an outer peripheral side with respect to the second connection terminal group.

In view of the above, in addition, an aspect provides a semiconductor device including a main substrate, a semiconductor module including at least one semiconductor element and mounted on a first surface of the main substrate, and a plurality of circuit elements mounted on the main substrate, in which: the circuit elements include a first circuit element mounted on the first surface, and a second circuit element mounted on a second surface on an opposite side from the first surface; the semiconductor module includes a plurality of connection terminals disposed in a shape of a plurality of rectangular rings on a side of a facing surface that faces the main substrate to be connected to the main substrate; the plurality of connection terminals include a first connection terminal group composed of a plurality of first connection terminals to be connected to the first circuit element via the main substrate, and a second connection terminal group composed of a plurality of second connection terminals to be connected to the second circuit element via the main substrate; and the first connection terminal group is disposed on an outer peripheral side with respect to the second connection terminal group.

With such configurations, the first connection terminals are easily connectable to the first circuit element on the first surface compared to the second connection terminals. That is, the first circuit element and the semiconductor module are mounted on the first surface, and thus the first circuit element and the first connection terminals can be connected to each other on the first surface without detouring to the second surface via a through hole. The second circuit element is mounted on the second surface on the opposite side from the first surface on which the semiconductor module is mounted. Thus, it is not necessary to install wires that extend from the second connection terminals on the first surface. The second connection terminals are connected to the connection terminals via a through hole in any case. Thus, the circuit elements and the semiconductor module can be efficiently connected to each other by disposing the first connection terminal group, which is composed of the plurality of first connection terminals, on the outer side with respect to the second connection terminal group, which is composed of the plurality of second connection terminals. With the present configuration, in this manner, the connection terminals of the semiconductor module can be disposed appropriately in accordance with the connection destination of the semiconductor module.

Further characteristics and advantages of the semiconductor module and the semiconductor device will become clear from the following description of an embodiment made with reference to the drawings.

BRIEF DESCRIPTION OF THE DRAWINGS

FIG. 10 is a plan view, as viewed in the V direction, illustrating an example of lands and the pattern of wires on a main substrate first surface.

FIG. 11 is a see-through view, as viewed in the V direction, illustrating an example of the pattern of wires on a main substrate second surface.

FIG. 12 is a plan view, as viewed in the V direction, illustrating another example of lands and the pattern of wires on the main substrate first surface.

FIG. 13 is a see-through view, as viewed in the V direction, illustrating another example of the pattern of wires on the main substrate second surface.

DETAILED DESCRIPTION OF EMBODIMENTS

A semiconductor device according to an embodiment will be described below with reference to the drawings. The semiconductor device can be mounted on a vehicle, for example, to be used as an ECU (Electronic Control Unit) that controls in-vehicle information devices. As a matter of course, the purpose of use of the semiconductor device is not limited thereto.

Figure 1:
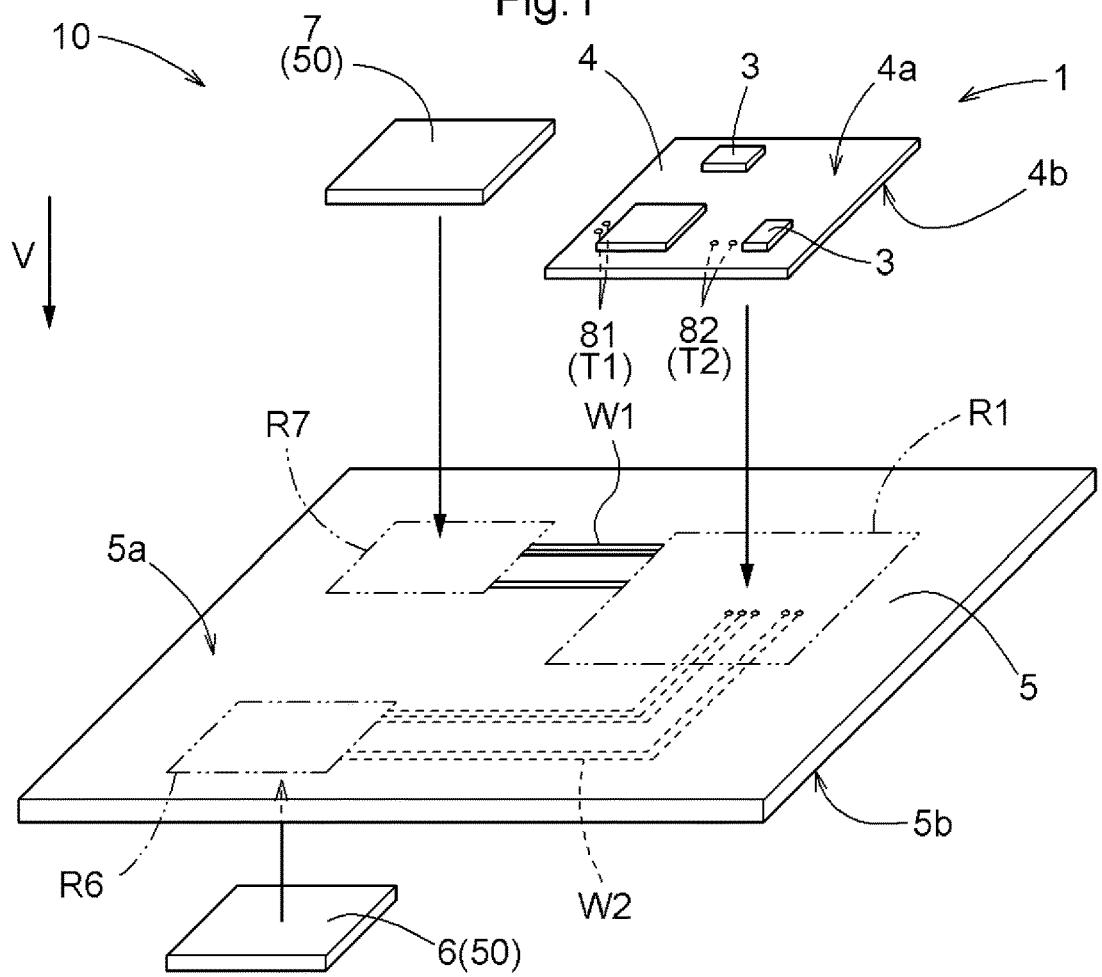
FIG. 1 is a schematic exploded perspective view of a semiconductor device.
Figure 2:
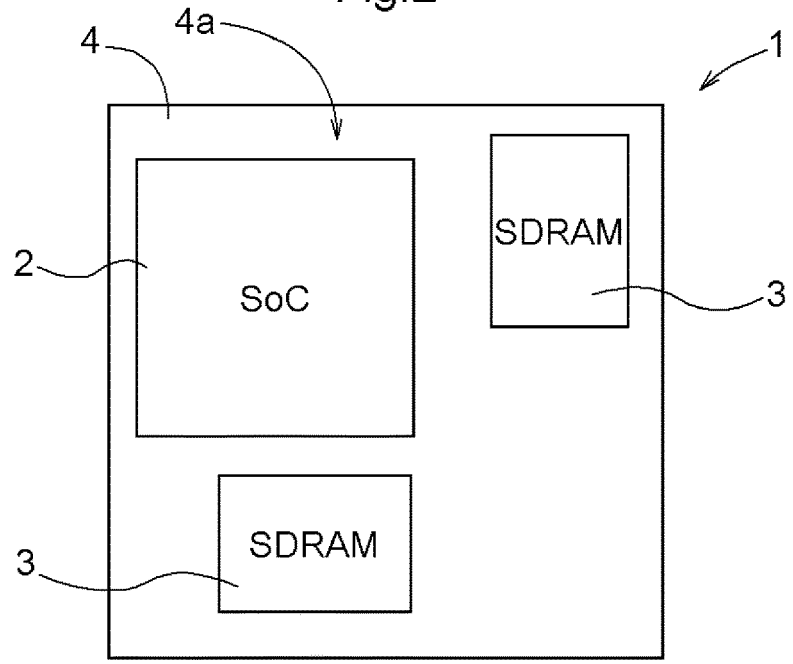
FIG. 2 illustrates the arrangement of components of a semiconductor module.

As illustrated in the schematic exploded perspective view in FIG. 1, the semiconductor device 10 is configured to include a main substrate 5, a semiconductor module 1 including at least one system LSI 2 (semiconductor element, processor) and mounted on a first surface (main substrate first surface 5a) of the main substrate 5, and a plurality of circuit elements 50 mounted on the main substrate 5. The circuit elements 50 include a first circuit element 7 mounted on the main substrate first surface 5a, and a second circuit element 6 mounted on a main substrate second surface 5b on the opposite side from the main substrate first surface 5a. The semiconductor module 1 includes the system LSI 2, memories 3 that cooperate with the system LSI 2, and a module substrate 4 on which the system LSI 2 and the memories 3 are mounted. In the present embodiment, as illustrated in the component arrangement diagram in FIG. 2, an SoC (System on a Chip) as the system LSI 2 and two SDRAMs (Synchronous Dynamic Random Access Memories) as the memories 3 are mounted on the module substrate 4. The SDRAMs are preferably each a DDR3 (Double Data Rate3) SDRAM, a DDR4 (Double Data Rate4) SDRAM, etc., for example.

While an SoC is indicated as an example of the system LSI 2, the system LSI 2 may be a SiP (System in a Package). The SoC includes an ASIC (Application Specific Integrated Circuit) which is a semi-custom LSI, an ASSP (Application Specific Standard Processor) which is a general-purpose LSI, etc. The ASIC is not limited to a gate array or a cell-based IC (standard cell), and also includes a PLD (Programmable Logic Device) such as an FPGA (Field Programmable Gate Array) and a PLA (Programmable Logic Array). While SDRAMs are indicated as an example of the memories 3, the memories 3 may each be a memory with a different structure such as a flash memory and an SRAM (Static RAM).

Figure 3:
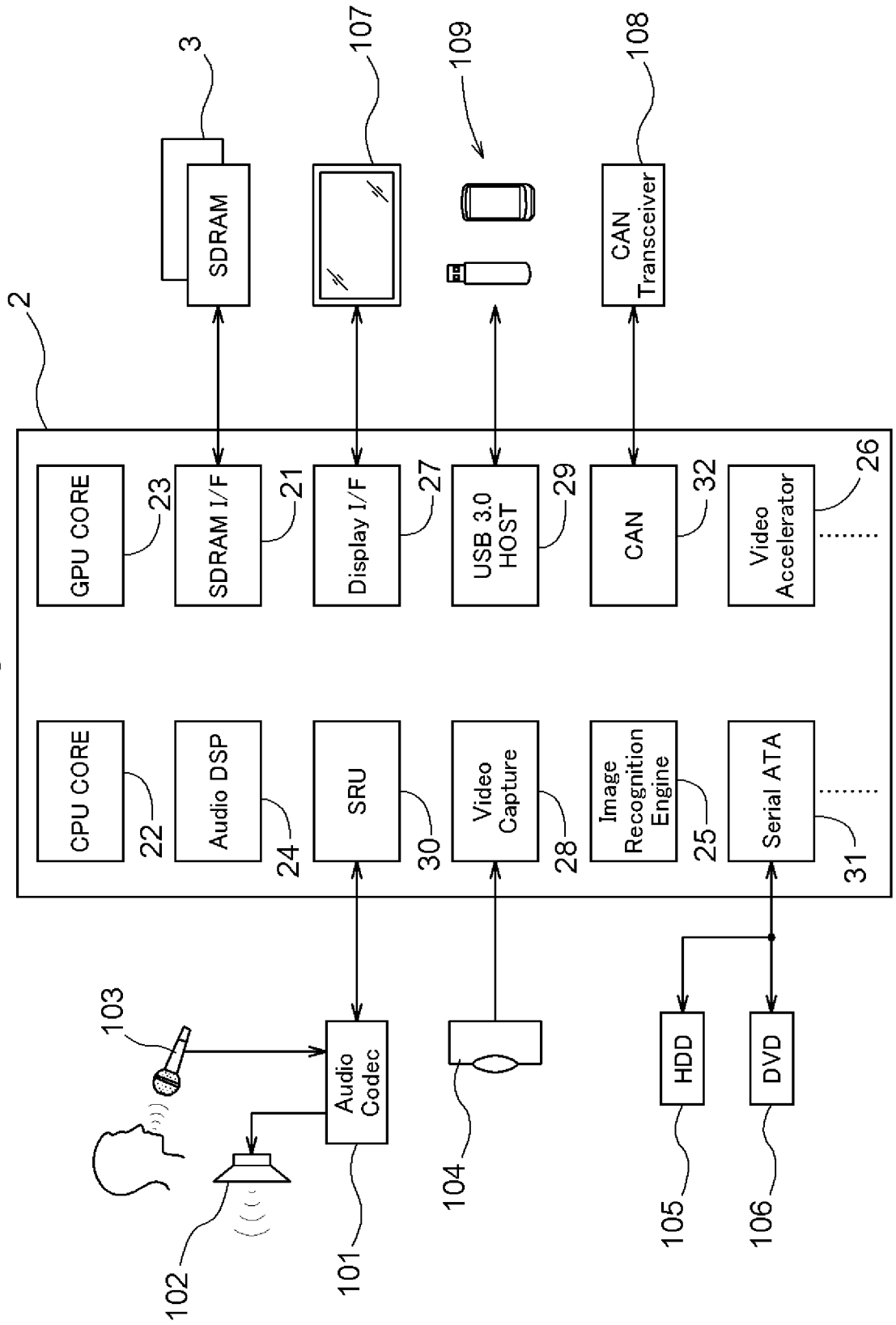
FIG. 3 is a schematic block diagram illustrating an example of a system LSI.

The schematic block diagram in FIG. 3 illustrates an example of the system LSI 2. As illustrated in FIG. 3, the system LSI 12 has functional blocks such as a CPU core (CPU CORE) 22, a GPU core (GPU CORE) 23, an audio DSP (Audio DSP), a memory interface (SDRAM I/F) 21, a sound routing unit (SRU) 30, a display interface (Display I/F) 27, a video capture (Video Capture) 28, a USB (Universal Serial Bus) host (USB 3.0 HOST) 29, an image recognition engine (Image Recognition Engine) 25, a CAN (Control Area Network) 32, a serial ATA (Serial ATA) 31, and a video accelerator (Video Accelerator) 26.

The CPU core 22 is a computation unit that includes a CPU (Central Processing Unit) that serves as the core of the system LSI 2. The CPU core 23 is a computation unit that includes a GPU (Graphic Processing Unit) that serves as the core for computation processes mainly related to images. The memory interface 21 is a functional section that serves as an interface when the system LSI 2 writes data into the SDRAMs as the memories 3, reads data from the SDRAMs, and refreshes data stored in the SDRAMs.

The audio DSP 24 is a DSP (Digital Signal Processor) that performs a process of decoding audio data configured in a variety of compression formats and save formats. The sound routing unit 30 is a computation unit that implements an acoustic effect such as surround playback using a speaker 102 via an audio codec device (Audio Codec) 101 etc. and that receives audio information such as voice etc. input to a microphone 103 via the audio codec device 101.

The video capture 28 is a computation unit that acquires an image captured by an in-vehicle camera 104, for example. The image recognition engine 25 is a computation unit that includes an ISP (Image Signal Processor) that performs image recognition based on an image captured by the in-vehicle camera 104 and acquired by the video capture 28. The video accelerator 26 is a computation unit that includes an ISP that performs a process of decoding movie data configured in a variety of compression formats and save formats. The display interface 27 is a computation unit that outputs an image captured by the in-vehicle camera 104 and acquired by the video capture 28 and an image decoded by the video accelerator 26 in accordance with the mode of display of a display 107 in the cabin, for example. A variety of information (such as characters and symbols) may be superimposed on the image captured by the in-vehicle camera 104 based on the result of the recognition by the image recognition engine 25, and the image may be partially highlighted.

The USB host 29 is a computation unit that serves as an interface for connection with various types of USB compatible devices 109 carried by a user such as a portable audio device, a smartphone, and a digital camera. The serial ATA 31 is a computation unit that serves as an interface with a hard disk drive (HDD) 105 and a DVD disk drive (DVD) 106. The CAN 32 is a computation unit that serves as an interface for communication in the vehicle via a CAN transceiver (CAN Transceiver) 108 in the vehicle.

Figure 4:
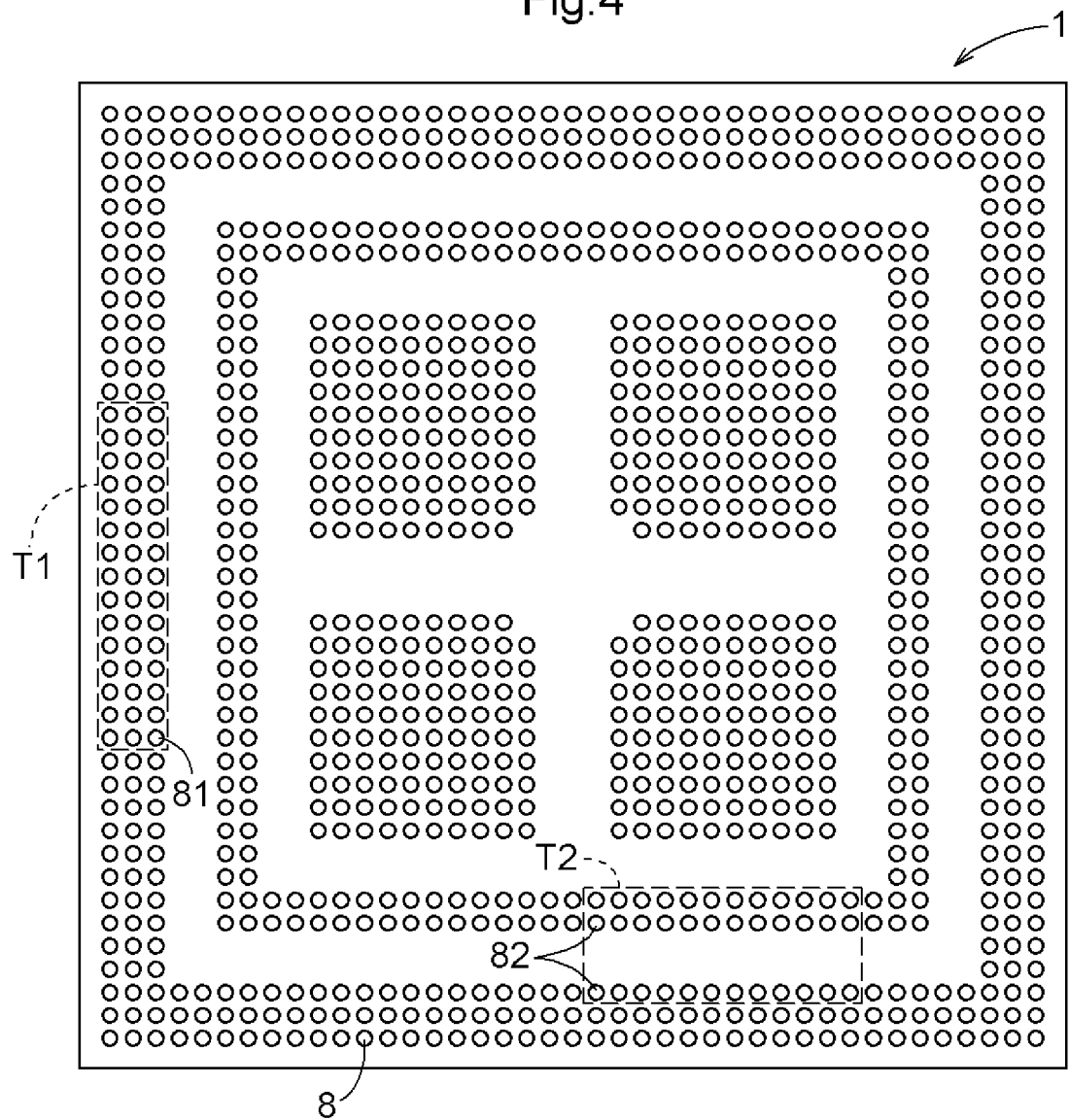
FIG. 4 is a see-through plan view, as viewed in the V direction, illustrating an example of the arrangement of terminals of the semiconductor module.
Figure 5:
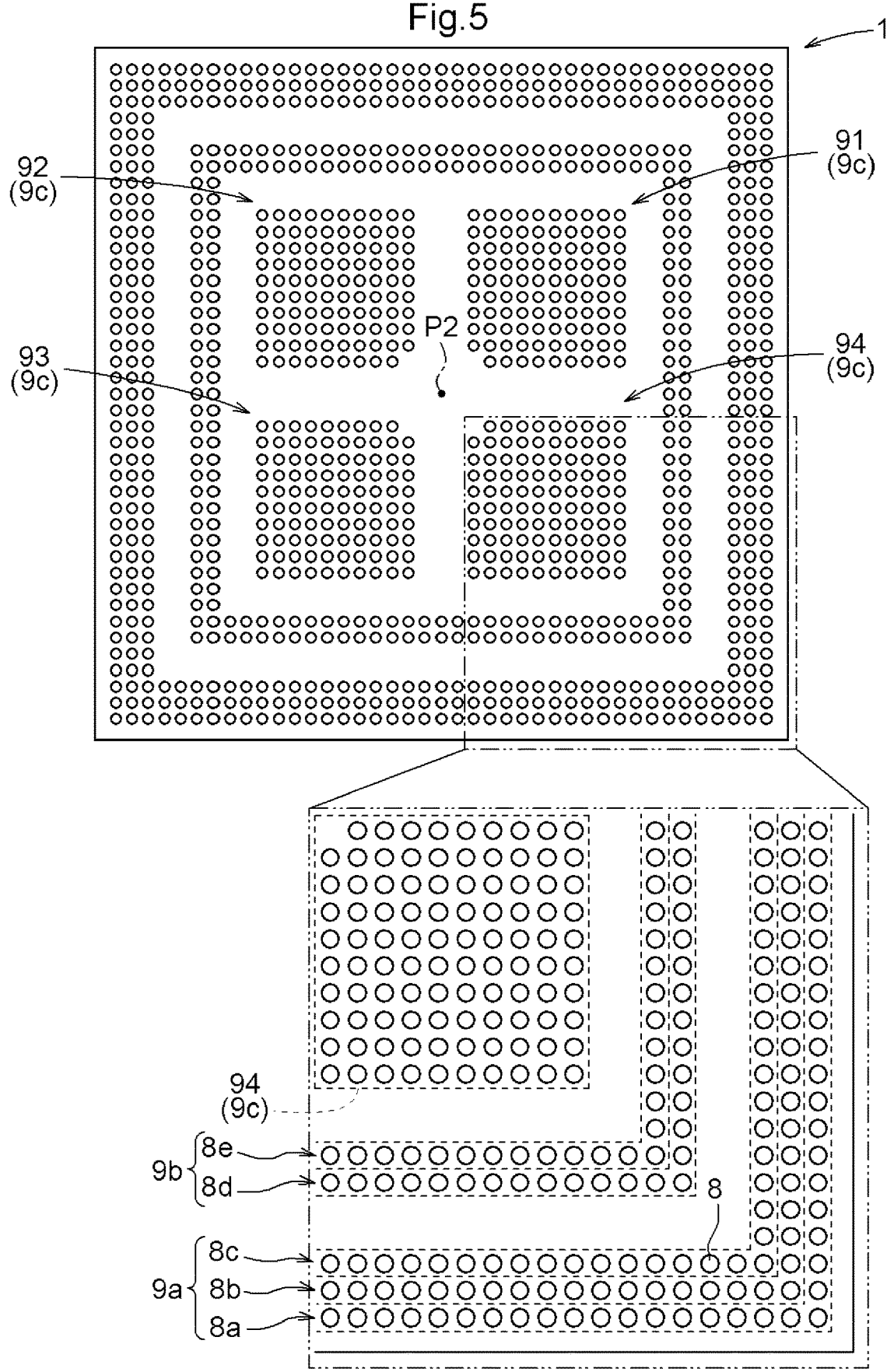
FIG. 5 is an enlarged see-through plan view, as viewed in the V direction, illustrating an example of the arrangement of the terminals of the semiconductor module.
Figure 9:
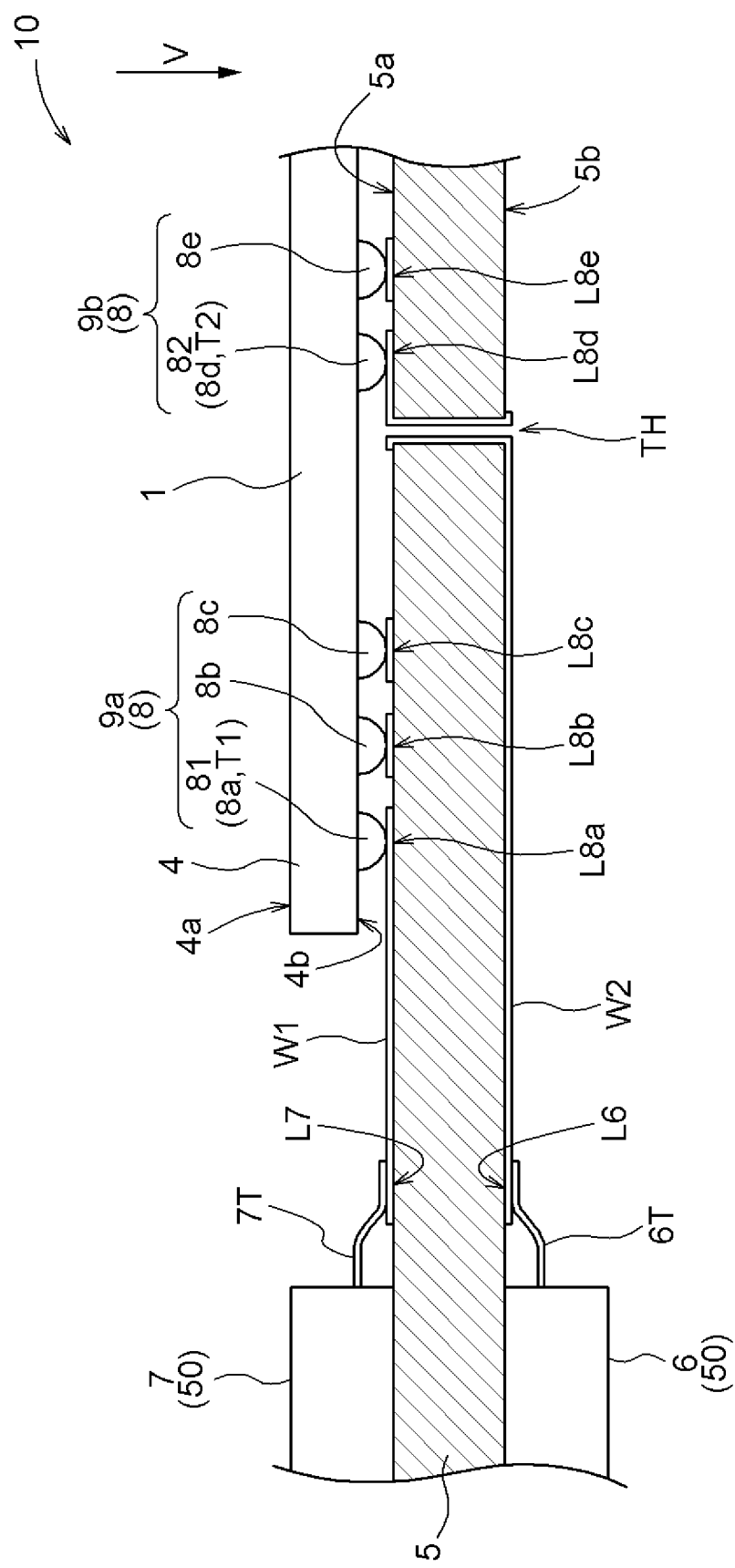
FIG. 9 is a sectional view illustrating an example of the semiconductor device.

The CPU core 22, the GPU core 23, the DSPs, the ISPs, etc. cooperate with the memories 3 to perform respective computation processes. The semiconductor module 1 is constituted as a multi-chip module that includes the system LSI 2, the memories 3 which cooperate with the system LSI, and the module substrate 4 on which the system LSI 2 and the memories 3 are mounted. As illustrated in FIG. 1, the system LSI 2 and the memories 3 are mounted on a module substrate first surface 4a which is one substrate surface of the module substrate 4 of the semiconductor module 1. As illustrated in FIGS. 4, 5, and 9, meanwhile, a plurality of hemispherical connection terminals 8 (module terminals) are disposed regularly on a module substrate second surface 4b (a facing surface that faces the main substrate 5), which is the other substrate surface of the module substrate 4, to be connected to the main substrate 5. As discussed in detail later, the connection terminals 8 are disposed in the shape of a plurality of rectangular rings. The connection terminals 8 include signal terminals for signal transmission and power source terminals for power transmission. The "signal terminals" include "input terminals", "output terminals", and "bidirectional terminals (input/output terminals)".

The system LSI 2 is composed of a plurality of functional blocks such as those discussed above, and similarly the semiconductor module 1 as a multi-chip module also has a plurality of functional blocks. As illustrated in FIG. 3, the functional blocks cooperate with respective specific circuits and devices. Thus, the functional blocks are connected to the specific circuits and devices via the connection terminals 8, or connected to interface circuits (receivers and drivers) or connectors of the devices. The circuit elements 50 illustrated in FIG. 1 correspond to the specific circuits, devices, interface circuits, connectors, etc. In FIG. 1, integrated circuits are indicated as an example of the first circuit element 7 and the second circuit element 6 as the circuit elements 50. As a matter of course, however, the circuit elements 50 are not limited to single integrated circuits, and may each be a circuit composed of a plurality of circuit components.

The connection terminals 8 which are disposed on the semiconductor module 1 are disposed in a concentrated manner for each identical function (or deeply associated functions) in consideration of the position of the circuit elements 50 as the connection destination, the wiring distance to the circuit elements 50, etc. FIG. 4 is a see-through plan view illustrating an example of the arrangement of the terminals of the semiconductor module 1 as viewed in plan in a direction V (see FIG. 1) which is orthogonal to the substrate surface of the main substrate 5 (as viewed in the V direction). FIG. 5 is an enlarged see-through plan view, as viewed in the V direction, illustrating an example of the arrangement of the terminals of the semiconductor module 1. As illustrated in FIG. 4, the plurality of connection terminals 8 include a first connection terminal group T1 including a plurality of first connection terminals 81 connected to the first circuit element 7 via the main substrate 5, and a second connection terminal group T2 including a plurality of second connection terminals 82 connected to the second circuit element 6 via the main substrate 5. As illustrated in FIG. 4, the first connection terminal group T1, of the connection terminals 8 which are disposed in the shape of a plurality of rectangular rings, is disposed on the outer peripheral side with respect to the second connection terminal group T2. It is only necessary that a part of the first connection terminal group T1 should be disposed on the outer peripheral side with respect to all of the second connection terminal group T2. For example, as illustrated in FIG. 4, both a part of the first connection terminal group T1 and a part of the second connection terminal group T2 may include terminals in the third ring from the outer peripheral side (third annular connection terminals 8c to be discussed later with reference to FIG. 5).

As illustrated in FIGS. 4 and 5, the connection terminals 8 which are disposed in the shape of rectangular rings roughly belong to three groups. The connection terminals 8 disposed in the outermost three rings are outer peripheral annular connection terminals 9a. When the connection terminals 8 in each ring of the outer peripheral annular connection terminals 9a which are disposed in the three rings are differentiated from each other, the connection terminals 8 in each ring are referred to as first annular connection terminals 8a, second annular connection terminals 8b, and third annular connection terminals 8c from the outer peripheral side toward the inner peripheral side. The first annular connection terminals 8a are "outermost peripheral connection terminals" disposed at the outermost periphery, of the plurality of connection terminals 8 which are disposed in the shape of the plurality of rectangular rings.

The connection terminals 8 disposed in the two rings on the inner peripheral side with respect to the outer peripheral annular connection terminals 9a with a clearance corresponding to one row of connection terminals 8 therebetween are inner peripheral annular connection terminals 9b. When the connection terminals 8 in each ring of the inner peripheral annular connection terminals 9b which are disposed in the two rings are differentiated from each other, the connection terminals 8 in each ring are referred to as fourth annular connection terminals 8d and fifth annular connection terminals 8e from the outer peripheral side toward the inner peripheral side.

The connection terminals 8 disposed in a grid shape at four locations so as to be four-fold rotationally symmetric on the inner side with respect to the inner peripheral annular connection terminals 9b with a clearance corresponding to one row of connection terminals 8 therebetween are inner peripheral grid connection terminals 9c. The term "four-fold rotationally symmetric" (four times symmetric, four-phase symmetric, 90-degree symmetric) refers to a shape that coincides when rotated by 90 degrees with reference to a symmetric point P2. The symmetric point P2 corresponds to the center of gravity of the outer shape of the semiconductor module 1 (module substrate 4) as viewed in the V direction. When the connection terminals 8 in each of the inner peripheral grid connection terminals 9c at the four locations are differentiated from each other, they are referred to as first grid connection terminals 91, second grid connection terminals 92, third grid connection terminals 93, and fourth grid connection terminals 94.

As discussed above, the first connection terminal group T1 is disposed on the outer peripheral side with respect to the second connection terminal group T2. The first connection terminals 81 included in the first connection terminal group T1 are connection terminals 8 that communicate a signal at a high frequency compared to the second connection terminals 82 included in the second connection terminal group T2. In many cases, the first connection terminals 81 are connection terminals 8 for a signal for communicating information through a pair of differential signals (communicating information through differential transmission).

For example, the in-vehicle camera 104, which can output an image signal for 30 frames/second or more with a high resolution of 400 million pixels or more, and the video capture 28 are occasionally connected to each other using differential signals. The display interface 27, which outputs a video signal with a high resolution of full high vision (1920 pixels×1080 pixels) or more, and the display 107 are often connected to each other using an HDMI (registered trademark) (High-Definition Multimedia Interface) standard for transmitting information using differential signals. The USB host 29 and the various types of USB compatible devices 109 also transmit information using differential signals. The connection terminals 8 used for these connections are connection terminals 8 that communicate a signal at a high frequency, and are connection terminals 8 that communicate a signal using a pair of differential signals.

On the other hand, a signal between the sound routing unit 30 and the audio codec device 101 and a signal between the CAN 32 and the CAN transceiver 108 have a low transmission speed compared to the image signal and the video signal discussed above, and have a low frequency. In many cases, these signals are transmitted using a transmission scheme called "single-ended transmission" in which one piece of information is transmitted using a single signal, rather than one piece of information is transmitted using a pair of differential signals.

Figure 6:
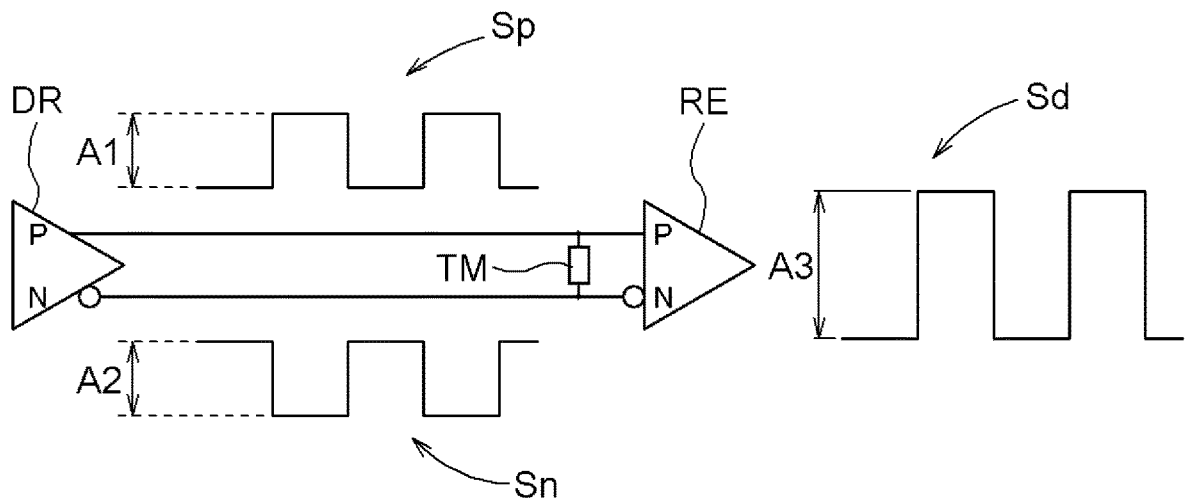
FIG. 6 illustrates the principle of differential transmission.
Figure 7:
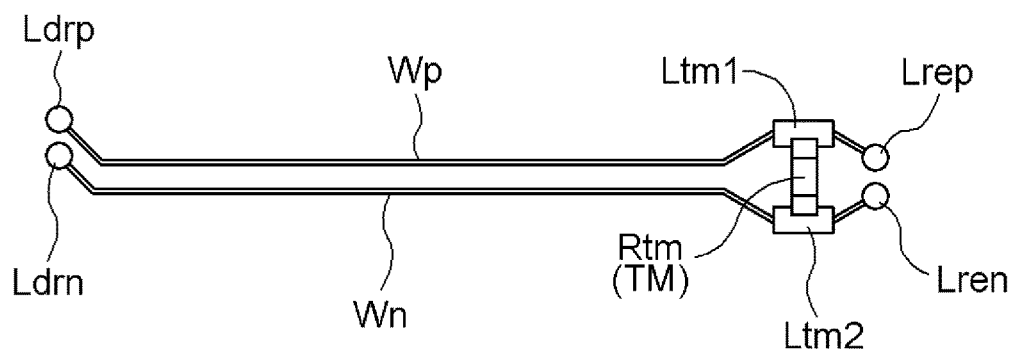
FIG. 7 illustrates an example of a pair of wires for signals to be transmitted differentially.
Figure 8:
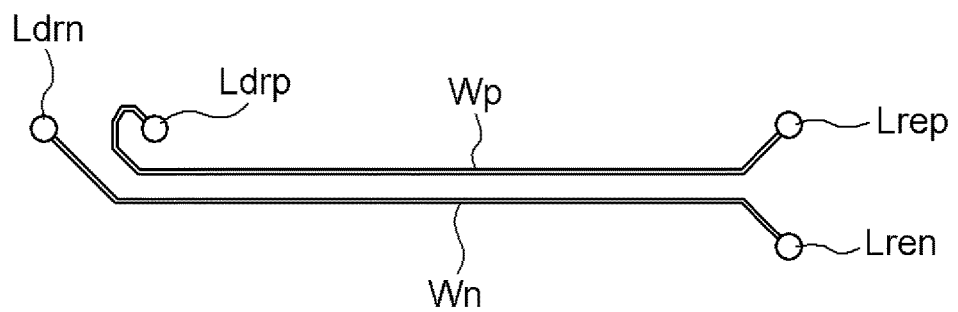
FIG. 8 illustrates another example of a pair of wires for signals to be transmitted differentially.

FIG. 6 illustrates the principle of the differential transmission. FIGS. 7 and 8 illustrate an example of wiring for a pair of signals to be transmitted differentially. In the differential transmission, as illustrated in FIG. 6, a driver DR which sends a signal and a receiver RE which receives a signal are connected to each other using a pair of differential signals, namely a positive signal Sp and a negative signal Sn. The positive signal Sp and the negative signal Sn have logics inverted from each other. The receiver RE is configured to have a differential amplifier, for example, and outputs a differential output Sd by subtracting the negative signal Sn from the positive signal Sp. As a result, a wave height A3 (amplitude=A3/2) of the differential output Sd is obtained by adding a wave height A1 (amplitude=A1/2) of the positive signal Sp and a wave height A2 (amplitude A2/2) of the negative signal Sn. That is, even if a signal is transmitted at a low power source voltage, a high wave height (amplitude) can be secured for the power source voltage, and thus resistance to external noise is enhanced. Even if common phase noise (common mode noise) is superimposed on the positive signal Sp and the negative signal Sn, the common phase noise can be canceled out through subtraction during differential amplification by the receiver RE.

In the single-ended signal transmission in which CMOS (Complementary Metal Oxide Semiconductor) elements are used, in general, a through current flows when the logic state is varied, and therefore a consumption current becomes larger as the frequency becomes higher (as the logic is varied more significantly). In the differential transmission, however, a current flows from the upper side of the CMOS element which outputs the positive signal Sp to the lower side of the CMOS element which outputs the negative signal Sn via a terminal resistor TM in one logic state, while a current flows from the upper side of the CMOS element which outputs the negative signal Sn to the CMOS element which outputs the positive signal Sp via the terminal resistor TM in the other logic state. Therefore, a through current does not flow when the logic state is varied in the differential transmission, unlike the single-ended signal transmission. Thus, an increase in the consumption current is suppressed even if the frequency of the transmitted signal becomes higher.

In the differential transmission, in which a through current does not flow and the terminal resistor TM is disposed as discussed above, disturbance in the waveform such as ringing, overshoots, and undershoots at signal variation points are suppressed compared to the single-ended signal transmission. Unwanted radiation is also suppressed because of the absence of a through current (relatively low energy), little disturbance in the waveform (unlikeliness of generation of harmonic waves), etc.

As described above, the differential transmission is a transmission method with a low power consumption and a high noise resistance, and is suitable for high-speed signal transmission at a high frequency and with a high consumption current.

In the differential transmission, information is communicated using the difference between two signals, and therefore it is desired that respective signal delays of the positive signal Sp and the negative signal Sn should be equivalent to each other. In high-frequency signal transmission, the idea of a distributed constant circuit, rather than a lumped constant circuit, is required also for transmission on a substrate such as the main substrate 5. Therefore, the terminal resistor TM is disposed between the positive signal Sp and the negative signal Sn to suppress signal reflection, and the lengths of transmission paths (signal wires) are made equivalent to each other in order to equalize a delay of the positive signal Sp and a delay of the negative signal Sn.

For example, as illustrated in FIG. 7, wires are formed such that a positive signal wire Wp that extends from a driver-side first land Ldrp to a receiver-side first land Lrep by way of a first resistor land Ltm1 of the terminal resistor TM and a negative signal wire Wn that extends from a driver-side second land Ldrn to a receiver-side second land Lren by way of a second resistor land Ltm2 of the terminal resistor TM have substantially the same shape as, or are symmetric with, each other.

While the distance between the driver-side first land Ldrp and the receiver-side first land Lrep and the distance between the driver-side second land Ldrn and the receiver-side second land Lren are substantially equal to each other in FIG. 7, such differences are occasionally different from each other, depending on the arrangement of the circuit elements 50. In such a case, as illustrated in FIG. 8, the negative signal wire Wn is detoured to be adjusted to the same wire length as that of the positive signal wire Wp (isometric wiring).

Although not illustrated, it is not preferable to install the positive signal wire Wp and the negative signal wire Wn in such a shape (route) that significantly breaks the symmetry between such wires, rather than fine adjustment for isometric wiring, bent the wires at an angle that is equal to or less than a right angle, and install the wires via a through hole. In particular, bending the wires at an angle that is equal to or less than a right angle and installing the wires via a through hole may cause signal reflection at such locations to disturb the signal waveform. Thus, signals for the differential transmission are preferably transmitted linearly on one substrate surface and not via a through hole.

It is known that, in the case where the wires are installed in the manner that is not suitable for signals for the differential transmission as discussed above, the eye pattern (eye diagram) is disturbed and a reduction in the communication quality (transmission quality) is observed. In high-speed signal transmission, in particular, the size (area) of the eye pattern (eye diagram) is small compared to constant-speed signal transmission. Therefore, in high-speed signal transmission, the proportion of the deviation is large compared to the size (area) of the eye pattern (eye diagram), even if the signals are delayed to the same degree, and therefore the eye pattern (eye diagram) is easily disturbed.

FIG. 9 is a schematic sectional view of the semiconductor device 10. The first annular connection terminal 8a is connected to a first annular land L8a. The second annular connection terminal 8b is connected to a second annular land L8b. The third annular connection terminal 8c is connected to a third annular land L8c. The fourth annular connection terminal 8d is connected to a fourth annular land L8d. The fifth annular connection terminal 8e is connected to a fifth annular land L8e.

The first circuit element 7, which is mounted on the main substrate first surface 5a together with the semiconductor module 1, is the circuit element 50 which communicates a signal with the semiconductor module 1 through the differential transmission. A first circuit element terminal 7T of the first circuit element 7 is an input signal or an output signal for differential signals, and is connected to a first circuit element land L7. The second circuit element 6, which is mounted on the main substrate second surface 5b, is the circuit element 50 which communicates a signal through the single-ended transmission, rather than the differential transmission. A second circuit element terminal 6T of the second circuit element 6 is an input signal or an output signal for a single-ended signal, and is connected to a second circuit element land L6.

As illustrated in FIG. 9, the first circuit element land L7, to which the first circuit element terminal 7T for differential signals is connected, is connected to the first annular land L8a via a first wire W1 on the main substrate first surface 5a. On the other hand, the second circuit element land L6, to which the second circuit element terminal 6T for a single-ended signal is connected, is connected to the fourth annular land L8d via a second wire W2 and a through hole TH. That is, the first circuit element terminal 7T and the first annular connection terminal 8a are connected to each other on an identical substrate surface (main substrate first surface 5a) not via the through hole TH. On the other hand, the second circuit element terminal 6T and the fourth annular connection terminal 8d are connected to each other through different substrate surfaces (main substrate first surface 5a and main substrate second surface 5b) via the through hole TH.

The connection terminals 8 of the semiconductor module 1 are disposed on the module substrate second surface 4b which is a facing surface that faces the main substrate first surface 5a, and all the connection terminals 8 are connected to the main substrate first surface 5a. Thus, in order to connect between the first circuit element 7 and the semiconductor module 1 on an identical substrate surface (main substrate first surface 5a), the first connection terminals 81 to be connected are preferably disposed on the outer side, among the connection terminals 8 in the shape of rectangular rings. As illustrated in FIGS. 4 and 5, the first annular connection terminals 8a which are the outermost peripheral connection terminals are allocated to the first connection terminals 81. In other words, the first annular connection terminals 8a which are the outermost peripheral connection terminals are included in the first connection terminal group T1 which is composed of the plurality of first connection terminals 81.

The second connection terminals 82 are terminals that may be connected via the through hole TH. Thus, if the first annular connection terminals 8a are allocated to the second connection terminals 82, a signal at a high frequency such as differential signals may not be allocated to the first annular connection terminals 8a instead. Thus, the first annular connection terminals 8a are preferably not allocated to the second connection terminals 82. As illustrated in FIGS. 4 and 5, the first annular connection terminals 8a which are the outermost peripheral connection terminals are not included in the second connection terminal group T2 which is composed of the plurality of second connection terminals 82.

An example of wiring will be described below. FIGS. 10 and 12 are each a plan view, as viewed in the V direction, illustrating an example of lands for the connection terminals 8 and the pattern of signal wires W formed on the main substrate first surface 5a. FIGS. 11 and 13 are each a see-through plan view, as viewed in the V direction, illustrating an example of the pattern of the signal wires W on the main substrate second surface 5b. The lands for the connection terminals 8 formed on the main substrate first surface 5a are indicated by the broken line in order to facilitate comparison with the main substrate first surface 5a. FIGS. 10 and 11 illustrate an example in which a maximum of two signal wires can be led between adjacent lands for the connection terminals 8. FIGS. 12 and 13 illustrate an example in which a maximum of one signal wire can be led between adjacent lands for the connection terminals 8. The connection terminals 8 are connected to the lands formed on the main substrate first surface 5a. Therefore, the phrase "signal wires that can be led between 'adjacent lands for the connection terminals 8' on the main substrate first surface 5a" is synonymous with the phrase "signal wires that can be led between 'adjacent connection terminals 8' on the main substrate first surface 5a".

As illustrated in FIG. 10, in the case where two signal wires W can be led between adjacent connection terminals 8, the first wires W1 which are connectable to the first circuit element 7 can be led out from the first annular lands L8a, the second annular lands L8b, and the third annular lands L8c through only the main substrate first surface 5a. Thus, the first annular connection terminals 8a, the second annular connection terminals 8b, and the third annular connection terminals 8c can be allocated to the first connection terminals 81.

The signal wires W for the fourth annular lands L8d, the fifth annular lands L8e, and the grid lands L9c to which the inner peripheral grid connection terminals 9c are connected can be led out from the main substrate first surface 5a in the case where there no first wires W1 from the second annular lands L8b or the third annular lands L8c. However, the first wires W1 may not necessarily be led out from the fourth annular lands L8d, the fifth annular lands L8e, and the grid lands L9c. The second wires W2 can be provided for these lands on the main substrate second surface 5b via the through holes TH as illustrated in FIG. 11. Thus, the fourth annular connection terminals 8d, the fifth annular connection terminals 8e, and the inner peripheral grid connection terminals 9c are preferably allocated to the second connection terminals 82.

As illustrated in FIG. 12, in the case where one signal wire W can be led between adjacent connection terminals 8, the first wires W1 which are connectable to the first circuit element 7 can be led out from the first annular lands L8a and the second annular lands L8b through only the main substrate first surface 5a. Thus, the first annular connection terminals 8a and the second annular connection terminals 8b can be allocated to the first connection terminals 81. As illustrated in FIG. 13, the second wires W2 can be provided on the main substrate second surface 5b via the through holes TH, although not described in detail because of the similarity to the description made above with reference to FIGS. 10 and 11. Thus, the third annular connection terminals 8c, the fourth annular connection terminals 8d, the fifth annular connection terminals 8e, and the inner peripheral grid connection terminals 9c are preferably allocated to the second connection terminals 82.

As is clear from the description made above with reference to FIGS. 10 and 12, the connection terminals 8 that can be allocated to the first connection terminals 81 depend on the number of signal wires that can be led between adjacent connection terminals 8 on the main substrate first surface 5a. The number of signal wires that can be led between adjacent connection terminals 8 on the main substrate first surface 5a is defined as n (n is a natural number). The first connection terminals 81 are preferably connection terminals 8 disposed in the (n+1) rectangular rings from the outermost periphery, of the plurality of connection terminals 8 which are disposed in the shape of the plurality of rectangular rings.

With the embodiment described above, the connection terminals 8 of the semiconductor module 1, which includes at least one semiconductor element (system LSI 2) and which is mounted on the main substrate first surface 5a, can be disposed appropriately in accordance with the connection destination of the semiconductor module 1 with the first circuit element 7 mounted on the main substrate first surface 5a and with the second circuit element 6 mounted on the main substrate second surface 5b.

Overview of Embodiment

The overview of the semiconductor module (1) and the semiconductor device (10) described above will be described below.

An aspect provides a semiconductor module (1) mounted on a first surface (5a) of a main substrate (5) and including at least one semiconductor element (2), with a first circuit element (7) mounted on the first surface (5a) and with a second circuit element (6) mounted on a second surface (5b) on an opposite side from the first surface (5a), the semiconductor module (1) including: a plurality of connection terminals (8) disposed in a shape of a plurality of rectangular rings on a side of a facing surface (4b) that faces the main substrate (5) to be connected to the main substrate (5), in which: the plurality of connection terminals (8) include a first connection terminal group (T1) composed of a plurality of first connection terminals (81) to be connected to the first circuit element (7) via the main substrate (5), and a second connection terminal group (T2) composed of a plurality of second connection terminals (82) to be connected to the second circuit element (6) via the main substrate (5); and the first connection terminal group (T1) is disposed on an outer peripheral side with respect to the second connection terminal group (T2).

In addition, an aspect provides a semiconductor device (10) including a main substrate (5), a semiconductor module (1) including at least one semiconductor element (2) and mounted on a first surface (5a) of the main substrate (5), and a plurality of circuit elements (50) mounted on the main substrate (5), in which: the circuit elements (50) include a first circuit element (7) mounted on the first surface (5a), and a second circuit element (6) mounted on a second surface (5b) on an opposite side from the first surface (5a); the semiconductor module (1) includes a plurality of connection terminals (8) disposed in a shape of a plurality of rectangular rings on a side of a facing surface (4b) that faces the main substrate (5) to be connected to the main substrate (5); the plurality of connection terminals (8) include a first connection terminal group (T1) composed of a plurality of first connection terminals (81) to be connected to the first circuit element (7) via the main substrate (5), and a second connection terminal group (T2) composed of a plurality of second connection terminals (82) to be connected to the second circuit element (6) via the main substrate (5); and the first connection terminal group (T1) is disposed on an outer peripheral side with respect to the second connection terminal group (T2).

With such configurations, the first connection terminals (7) are easily connectable to the first circuit element (7) on the first surface (5a) compared to the second connection terminals (82). That is, the first circuit element (7) and the semiconductor module (1) are mounted on the first surface (5a), and thus the first circuit element (7) and the first connection terminals (7) can be connected to each other on the first surface (5a) without detouring to the second surface (5b) via a through hole (TH). The second circuit element (6) is mounted on the second surface (5b) on the opposite side from the first surface (5a) on which the semiconductor module (1) is mounted. Thus, it is not necessary to install wires that extend from the second connection terminals (82) on the first surface (5a). The second connection terminals (82) are connected to the connection terminals (8) via a through hole (TH) in any case. Thus, the circuit elements (50) and the semiconductor module (1) can be efficiently connected to each other by disposing the first connection terminal group (T1), which is composed of the plurality of first connection terminals (81), on the outer side with respect to the second connection terminal group (T2), which is composed of the plurality of second connection terminals (82). With the present configuration, in this manner, the connection terminals of the semiconductor module (1) can be disposed appropriately in accordance with the connection destination of the semiconductor module (1).

Preferably, when connection terminals (8) disposed at an outermost periphery, of the plurality of connection terminals (8) disposed in the shape of the plurality of rectangular rings, are defined as outermost peripheral connection terminals (8a), the first connection terminal group (T1) includes the outermost peripheral connection terminals (8a), and the second connection terminal group (T2) does not include the outermost peripheral connection terminals (8a).

If the outermost peripheral connection terminals (8a) are allocated to the first connection terminals (81), the first circuit element (7) and the first connection terminals (7) can be easily connected to each other on the first surface (5a). The second circuit element (6) is mounted on the second surface (5b), and thus the second connection terminals (82) are connected via a through hole (TH). Therefore, if the outermost peripheral connection terminals (8a) are allocated to the second connection terminals (82), the first connection terminals (81) may not be allocated to the outermost peripheral connection terminals (8a) instead. Thus, the outermost peripheral connection terminals (8a) are preferably not allocated to the second connection terminals (82).

Preferably, the first connection terminals (81) are connection terminals (8) that communicate a signal at a high frequency compared to the second connection terminals (82).

Signals at a high frequency are susceptible to the effect of the wiring length and the wiring shape, and highly likely to incur a reduction in the transmission quality, compared to signals at a low frequency. A through hole (TH) tends to cause reflection of a signal, and tends to increase the wiring length with a wire extending between the first surface (5a) and the second surface (5b). Thus, a signal at a relatively high frequency is preferably connected on the same substrate surface and not via a through hole (TH). Thus, connection terminals (8) that communicate a signal at a relatively high frequency are preferably the first connection terminals (81).

Preferably, when a number of signal wires (W) allowed to pass between adjacent connection terminals (8) on the first surface (5a) is defined as n (n is a natural number), the first connection terminals (81) are connection terminals (8) disposed in (n+1) rectangular rings from an outermost periphery, of the plurality of connection terminals (8) disposed in the shape of the plurality of rectangular rings.

In order to lead out the signal wires (W) on the first surface (5a) to the outside of the semiconductor module (1) from the connection terminals (8) which are disposed on the inner peripheral side as seen in a direction that is orthogonal to a substrate surface of the main substrate (5), it is necessary to lead the signal wires (W) between the connection terminals (8) which are disposed on the outer peripheral side with respect to the connection terminals (8) on the inner peripheral side. The distance between a signal wire (W) and a signal wire (W) and the distance between a signal wire (W) and a land for mounting a connection terminal (8) are prescribed by the voltage of a signal, the material of the main substrate (5), etc. Thus, the number of signal wires (W) that can be led between adjacent connection terminals (8) is also prescribed by the voltage of a signal, the material of the main substrate (5), etc. If the number of signal wires (W) that can be led between adjacent connection terminals (8) is small, it is difficult to lead out the signal wires (W) from the connection terminals (8) connected on the inner peripheral side. Thus, the first connection terminals (81) are preferably allocated in accordance with the number of signal wires (W) that can be led between adjacent connection terminals (8).

DESCRIPTION OF THE REFERENCE NUMERALS

1 SEMICONDUCTOR MODULE
2 SYSTEM LSI (SEMICONDUCTOR ELEMENT)
4b MODULE SUBSTRATE SECOND SURFACE (FACING SURFACE THAT FACES MAIN SUBSTRATE)
5 MAIN SUBSTRATE
5a MAIN SUBSTRATE FIRST SURFACE (FIRST SURFACE OF MAIN SUBSTRATE)
5b MAIN SUBSTRATE SECOND SURFACE (SECOND SURFACE OF MAIN SUBSTRATE)
6 SECOND CIRCUIT ELEMENT
6T SECOND CIRCUIT ELEMENT TERMINAL
7 FIRST CIRCUIT ELEMENT
7T FIRST CIRCUIT ELEMENT TERMINAL
8 CONNECTION TERMINAL
8a FIRST ANNULAR CONNECTION TERMINAL (OUTERMOST PERIPHERAL TERMINAL)
10 SEMICONDUCTOR DEVICE
21 MEMORY INTERFACE
50 CIRCUIT ELEMENT
81 FIRST CONNECTION TERMINAL
82 SECOND CONNECTION TERMINAL
91 FIRST GRID CONNECTION TERMINAL
92 SECOND GRID CONNECTION TERMINAL
93 THIRD GRID CONNECTION TERMINAL
94 FOURTH GRID CONNECTION TERMINAL
T1 FIRST CONNECTION TERMINAL GROUP
T2 SECOND CONNECTION TERMINAL GROUP
TH THROUGH HOLE

The invention claimed is:

1. A semiconductor module mounted on a first surface of a main substrate and including at least one semiconductor element, with a first circuit element mounted on the first surface and with a second circuit element mounted on a second surface on an opposite side from the first surface, the semiconductor module comprising:
   a plurality of connection terminals disposed in a shape of a plurality of rectangular rings on a side of a facing surface that faces the main substrate to be connected to the main substrate, wherein:
   the plurality of connection terminals include a first connection terminal group composed of a plurality of first connection terminals to be connected to the first circuit element via a wiring that passes only along the first surface of the main substrate, and a second connection terminal group composed of a plurality of second connection terminals to be connected to the second circuit element via the main substrate; and
   the first connection terminal group is disposed on an outer peripheral side with respect to the second connection terminal group,
   wherein the first circuit element transmits a differential transmission using a pair of differential signals and the second circuit element transmits a single signal.

2. The semiconductor module according to claim 1, wherein when connection terminals disposed at an outermost periphery, of the plurality of connection terminals disposed in the shape of the plurality of rectangular rings, are defined as outermost peripheral connection terminals, the first connection terminal group includes the outermost peripheral connection terminals, and the second connection terminal group does not include the outermost peripheral connection terminals.

3. The semiconductor module according to claim 1, wherein the first connection terminals are connection terminals that communicate a signal at a high frequency compared to the second connection terminals.

4. The semiconductor module according to claim 1, wherein when a number of signal wires allowed to pass between adjacent connection terminals on the first surface is defined as n (n is a natural number), the first connection terminals are connection terminals disposed in (n+1) rectangular rings from an outermost periphery, of the plurality of connection terminals disposed in the shape of the plurality of rectangular rings.

5. A semiconductor device comprising a main substrate, a semiconductor module including at least one semiconductor element and mounted on a first surface of the main substrate, and a plurality of circuit elements mounted on the main substrate, wherein:
   the circuit elements include a first circuit element mounted on the first surface, and a second circuit element mounted on a second surface on an opposite side from the first surface;
   the semiconductor module includes a plurality of connection terminals disposed in a shape of a plurality of rectangular rings on a side of a facing surface that faces the main substrate to be connected to the main substrate;

the plurality of connection terminals include a first connection terminal group composed of a plurality of first connection terminals to be connected to the first circuit element via a wiring that passes only along the first surface of the main substrate, and a second connection terminal group composed of a plurality of second connection terminals to be connected to the second circuit element via the main substrate; and the first connection terminal group is disposed on an outer peripheral side with respect to the second connection terminal group, wherein the first circuit element transmits a differential transmission using a pair of differential signals and the second circuit element transmits a single signal.

6. The semiconductor device according to claim 5, wherein when connection terminals disposed at an outermost periphery, of the plurality of connection terminals disposed in the shape of the plurality of rectangular rings, are defined as outermost peripheral connection terminals, the first connection terminal group includes the outermost peripheral connection terminals, and the second connection terminal group does not include the outermost peripheral connection terminals.

7. The semiconductor device according to claim 5, wherein the first connection terminals are connection terminals that communicate a signal at a high frequency compared to the second connection terminals.

8. The semiconductor device according to claim 5, wherein when a number of signal wires allowed to pass between adjacent connection terminals on the first surface is defined as n (n is a natural number), the first connection terminals are connection terminals disposed in (n+1) rectangular rings from an outermost periphery, of the plurality of connection terminals disposed in the shape of the plurality of rectangular rings.

* * * * *